US008687756B2

(12) United States Patent
Sindalovsky et al.

(10) Patent No.: US 8,687,756 B2
(45) Date of Patent: Apr. 1, 2014

(54) CDR WITH DIGITALLY CONTROLLED LOCK TO REFERENCE

(75) Inventors: Vladimir Sindalovsky, Perkasie, PA (US); Lane A. Smith, Easton, PA (US); Brett D. Hardy, Chaska, MN (US); Jeffrey S. Kueng, New Brighton, MN (US)

(73) Assignee: LSI Corporation, Milpitas, CA (US)

( * ) Notice: Subject to any disclaimer, the term of this patent is extended or adjusted under 35 U.S.C. 154(b) by 325 days.

(21) Appl. No.: 13/235,628

(22) Filed: Sep. 19, 2011

(65) Prior Publication Data

US 2013/0070835 A1 Mar. 21, 2013

(51) Int. Cl.
*H03D 3/24* (2006.01)

(52) U.S. Cl.
USPC .......................................... 375/376; 331/25

(58) Field of Classification Search
USPC ............. 375/327, 376; 327/156, 159; 331/10, 331/17, 25
See application file for complete search history.

(56) References Cited

U.S. PATENT DOCUMENTS

| | | | |
|---|---|---|---|
| 6,545,507 B1 | 4/2003 | Goller | |
| 7,366,267 B1 | 4/2008 | Lee et al. | |
| 7,742,553 B1 | 6/2010 | Bataineh et al. | |
| 2005/0111605 A1* | 5/2005 | Loke et al. | 375/375 |
| 2006/0009184 A1* | 1/2006 | Goldman | 455/260 |
| 2007/0071156 A1* | 3/2007 | Gregorius et al. | 375/376 |
| 2007/0247234 A1* | 10/2007 | Roper | 331/16 |
| 2009/0092213 A1 | 4/2009 | Eker et al. | |
| 2009/0147901 A1 | 6/2009 | Do et al. | |
| 2009/0243735 A1 | 10/2009 | Luiz et al. | |
| 2009/0284319 A1* | 11/2009 | Wang | 331/16 |
| 2010/0102888 A1 | 4/2010 | Edwards et al. | |
| 2010/0208857 A1* | 8/2010 | Chen et al. | 375/376 |
| 2010/0283549 A1* | 11/2010 | Wang | 331/34 |

* cited by examiner

Primary Examiner — Don N Vo

(57) ABSTRACT

In described embodiments, a receiver includes a clock and data recovery (CDR) circuit with a voltage control oscillator (VCO) having proportional and integral loop control, and a Lock to Reference (L2R) mode circuit using Phase and Frequency Detector (PFD) control of the VCO during the absence of input data to the CDR. A regular CDR second order loop incorporating PFD control of the VCO during the absence of input data to the CDR achieves relatively rapid lock to reference when compared to counter-based lock to reference mode of operation.

21 Claims, 7 Drawing Sheets

CDR WITH DIGITALLY CONTROLLED LOCK TO REFERENCE

BACKGROUND OF THE INVENTION

1. Field of the Invention

The present invention relates to communication transceiver clock and data recovery (CDR) circuits, and, in particular, to a CDR incorporating digitally controlled lock to reference circuitry.

2. Description of the Related Art

In many data communication applications, Serializer and De-serializer (SerDes) devices facilitate the transmission between two points of parallel data across a serial link. Data at one point is converted from parallel data to serial data and transmitted through a communications channel to the second point where it received and converted from serial data to parallel data.

At high data rates, frequency-dependent signal loss from the communications channel (e.g., the signal path between the two end points of a serial link) as well as signal dispersion and distortion can occur. As such, the communications channel, whether wired, optical, or wireless, acts as a filter and might be modeled in the frequency domain with a transfer function. Correction for frequency dependent losses of the communications channel, and other forms of signal degradation, often requires signal equalization at a receiver of the signal. Equalization through use of one or more equalizers compensates for the signal degradation to improve communication quality. Equalization may also be employed at the transmit side to pre-condition the signal. Equalization, a form of filtering, generally requires some estimate of the transfer function of the channel to set its filter parameters. However, in many cases, the specific frequency-dependent signal degradation characteristics of a communications channel are unknown, and often vary with time. In such cases, an equalizer with adaptive setting of parameters providing sufficient adjustable range might be employed to mitigate the signal degradation of the signal transmitted through the communications channel. An automatic adaptation process is often employed to adjust the equalizer's response. Equalization might be through a front end equalizer, a feedback equalizer, or some combination of both.

A clock and data recovery (CDR) circuit detects timing of the input data stream and uses such detected timing to set correct frequency and phase of a local clock from which the sampling clock for data sampling is derived. As employed herein, "placing" a sampler (latch) in a data stream requires setting a voltage threshold and clocking phase of the sampler to detect a predetermined point in a data eye. Clocking the data sampler with a clock signal with known frequency and phase derived with respect to the detected symbol timing of data allows for clock recovery of symbols within the data stream generating the data eye.

CDR circuits form a critical part of the receiver in a SerDes device. The objective of the CDR circuit is to track the phase of a sampling clock based on some criterion, such as minimized mean-squared-error (MMSE). To track the phase of a sampling clock based on a given criterion, the CDR circuit generates (timing) error samples with respect to the data sampling clock, and adaptively sets the local clock phase used to derive the data sampling clock so as to minimize the timing error with respect to the criterion between successive sampling events. The CDR circuit desirably operates so as to achieve very low target bit-error-ratio (BER) (usually, on the order of 1e-12 or 1e-15). The CDR circuits commonly employed might be broadly classified into two categories: baud-rate CDR circuits and bang-bang CDR circuits, with each class having associated advantages and disadvantages.

Known methods and devices use direct control of a receiver's VCO (RXVCO) in a digitally controlled CDR. In these methods, one or more D/A converters convert the digital control word(s) from the CDR to an analog control signal to apply to the control voltage input of the VCO. To improve receiver jitter tolerance and overcome the impact of process variation on the VCO, the resolution of the word applied to control the VCO must generally be increased. To minimize the area, power and cost of the CDR and D/A converter(s), the resolution of the control word (i.e., the number of bits contained in the word) applied to the VCO is minimized. However, with a low resolution control word, the VCO output frequency step size produces significant quantization noise. This significant quantization noise results in degraded CDR jitter tolerance to low frequency periodic jitter, especially in those applications where the incoming serial data rate is modulated by a spread spectrum clock. Increasing the resolution of the control word to improve receiver jitter tolerance increases circuit area, increases device power, and increases circuit costs.

FIG. 1 shows an exemplary clock and data recovery (CDR) circuit 100 of prior art systems including receiver VCO (RXVCO) 110. Serial data, after potentially going through linear equalization and decision feedback equalization (DFE), is applied to data slicers 102 which sample data once per unit interval (or, more frequently, typically oversampling data by at least a factor of 2) to provide samples to phase detector 104, as well as to data recovery circuitry (not shown in FIG. 1). Sampled data provided to phase detector 104 allows CDR 100 to determine sampling clock alignment within the data eye of the received serial data, and perform clock recovery from the incoming serial data. Phase detector 104 generates sampling clock up and down phase adjustments (UP and DN, respectively), thereby providing sampling clock with adjusted frequency and phase to data slicers 102.

RXVCO 110 utilizes two control loops, proportional and integral, which allow for more precise tracking of the incoming data rate as its frequency deviates from the nominal rate. RXVCO 110 might be implemented as one or more D/A converters with their outputs fed to the control voltage input(s) of an inductor-capacitor (LC) oscillator with varactor-type control of the frequency, or as a ring-based VCO with current or voltage controlling the delay of its delay stages.

A phase update request from phase detector 104 might optionally utilize majority vote block 106, where multiple phase update requests are converted to a single up, down, or no phase update. The resulting phase update from majority vote block 106 might also be processed by optional gear shifting block 112 and multiplier 108. This processing by optional gear shifting block 112 and multiplier 108 might have a higher multiplication coefficient in the initial phase of locking to a serial data stream, providing for wider bandwidth, in order to reduce time-to-lock of RXVCO 110. After start-up, over the course of time, the gain of gear shifting block 112 and multiplier 108 is reduced, narrowing the CDR loop bandwidth, and, thus, reducing self-jitter characteristic of a non-linear bang-bang phase detector based implementation of CDR 100. The final phase update request from the gear shifting multiplier is applied as a proportional control word to RXVCO 110.

The output frequency $F_{VCO}$ of RXVCO 110 is a function of integral control word $D_I$ with $KVCO_I$ gain and proportional control word $D_P$ with $KVCO_P$ gain. Proportional control has a character of pulse width modulation control. Each time proportional control is applied for a limited duration of time, the proportional control causes a temporary change in frequency $F_{VCO}$ of RXVCO 110. As a result, phase $\Phi_{VCO}$ of RXVCO 110 changes by some amount up or down without permanent change to frequency $F_{VCO}$ of RXVCO 110. The frequency ($F_{VCO}$) and phase ($\Phi_{VCO}$) are given by relations (1) and (2).

$$F_{VCO} = F_0 + D_I * KVCO_I + D_P * KVCO_P \qquad (1)$$

$$\Phi_{VCO} = \int F_{VCO} dt, \qquad (2)$$

where $F_0$ is the characteristic RXVCO frequency with both proportional and integral controls held at zero, $D_P$ is the proportional control, $KVCO_P$ is the proportional VCO gain, $D_I$ is the integral control, and $KVCO_I$ is the integral VCO gain.

Returning to FIG. 1, the output from phase detector 104 might optionally be decimated in decimator 114, and might also be processed by optional gear shifting block 112 and multiplier 109. After this optional processing, the output from phase detector 104 is applied to limiting integrator 116. Integral control, unlike proportional control, changes for an extended duration of time until limiting integrator 116 accumulates a different integer value. The integer value of limiting integrator 116 is the integral control word applied to RXVCO 110. Processing frequency might be reduced through use of decimated output of phase detector 104 that is provided by decimator 114. Again, as described previously, the integral control is modified at startup through action of gear shifting control and multiplier 109. The integer value of limiting integrator 116 is a coarse quantization of integral control of RXVCO 110, and the fractional value is optionally used due to RXVCO 110 implementation limitations.

When serial data is not present at the input of data slicers 102, (which is usually indicated by RX Loss Of Signal LOS detector, not shown in FIG. 1), the CDR loop is no longer closed since phase detector 104 does not provide UP and DN signals to keep the RXVCO frequency phase locked to input serial data. Under this condition, the frequency and phase of RXVCO 110 might drift far from the expected data rate, making it impossible to lock to serial data when it becomes available again. In order to avoid this situation, the frequency and phase of RXVCO 110 is desirably held in lock to a reference clock until serial data is available again. One method of the prior art uses a counter-based lock to reference, and an exemplary block diagram of the counter-based lock to reference is shown in FIG. 2.

As given above, the equation for RXVCO output frequency as a function of proportional and integral controls can be expressed as in relations (1) and (2). The output frequency $F_{VCO}$ of the RXVCO is a function of integral control word $D_I$ with $KVCO_I$ gain and proportional control word $D_P$ with $KVCO_P$ gain. Proportional control has a character of pulse width modulation, and integral control is simply level based. FIG. 2 shows a portion of the CDR of FIG. 1 incorporating a counter-based lock to reference mode of operation of the prior art.

As shown in FIG. 2, counter-based lock to reference 200 comprises frequency divider 201, counter1 202, counter2 203, FSM (finite state machine) 204, and MUX 205, which are employed in combination with RXVCO 110 and limiting integrator 116 when loss of serial data to the CDR input data slicers is detected. Whenever the serial input goes down (e.g. a control signal LOS is set high) a Lock to Reference (L2R) mode is invoked. MUX 205, based on the L2R mode indication, switches the integral control from limiting integrator 116 to the output of FSM 204.

In L2R mode, the output signal frequency of RXVCO 110 is divided down in frequency divider 201 to the rate rationally related to the Reference Clock rate. The output of frequency divider 201 is counted in counter1 202 for a duration of a predefined number of Reference Clock periods that is counted with counter2 203. The count in counter1 202 is compared, by FSM 204, to the expected count over time interval of counter2 203 when RXVCO frequency is at the Reference Clock related rate, and an UP or DN adjustment is generated by FSM 204 based on the comparison. The UP or DN adjustment is made to the Integral RXVCO Control. After the adjustment, the counting cycle is repeated until return of the serial input (e.g. a control signal loss LOS is set low). At the end of L2R mode, when serial input is again present and used for closing RXVCO loop control, the integral control word is loaded into limiting integrator 116 to serve as an initial integral control word.

Size of counter1 202 is designed large enough in order to maintain close alignment of RXVCO rate to the Reference Clock rate. For example, if counter1 202 counts to 1,000, this count corresponds to a resolution of 1,000 ppm. Since frequency adjustment of the output signal of RXVCO 110 may take several counting cycles, the duration of time that RXVCO 110 is forced to stay in L2R mode might be significant. A counter-based lock to reference frequency detector takes hundreds of microseconds to adjust RXVCO frequency to the reference clock rate, which is unacceptable for SAS, SATA, and other applications since lock to reference is invoked at every loss of signal or after partial power down. A CDR is desirably ready in a few microseconds to start receiving serial data error free.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, the present invention allows for controlling an oscillation frequency and phase in a receiver during a lock to reference (L2R) mode. A voltage-controlled oscillator (VCO) generates an output signal at the oscillation frequency and phase based on a proportional control word and an integral control word. A frequency divider divides the output signal oscillation frequency of the VCO to substantially equivalent to a reference clock rate. A phase and frequency detector (PFD) generates an L2R mode oscillation phase error from a comparison of the divided output signal oscillation frequency of the VCO and the reference clock. A proportional loop control generates the proportional control word from the L2R mode oscillation phase error; and an integral loop control integrates the L2R mode oscillation phase error to provide the integral control word to the voltage-controlled oscillator.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

In accordance with embodiments of the present invention, a receiver includes a clock and data recovery (CDR) circuit with a voltage control oscillator (VCO) having proportional and integral loop control, and a Lock to Reference (L2R) mode circuit using Phase and Frequency Detector (PFD) control of the VCO during the absence of input data to the CDR. A regular CDR second order loop incorporating PFD control of the VCO during the absence of input data to the CDR achieves relatively rapid lock to reference when compared to a counter-based lock to reference mode of operation.

Figure 1:
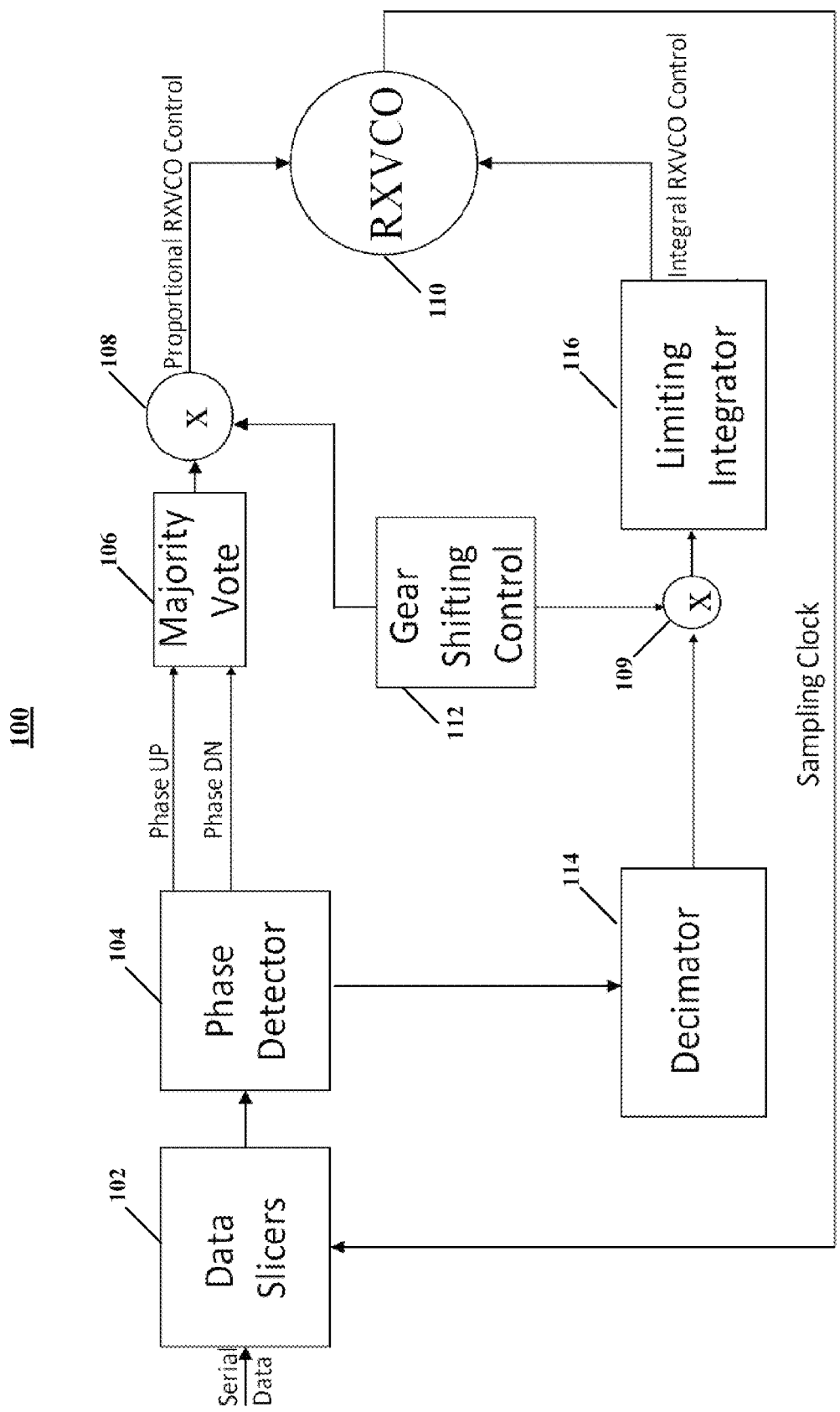
FIG. 1 shows an exemplary clock and data recovery (CDR) circuit of prior art systems.
Figure 2:
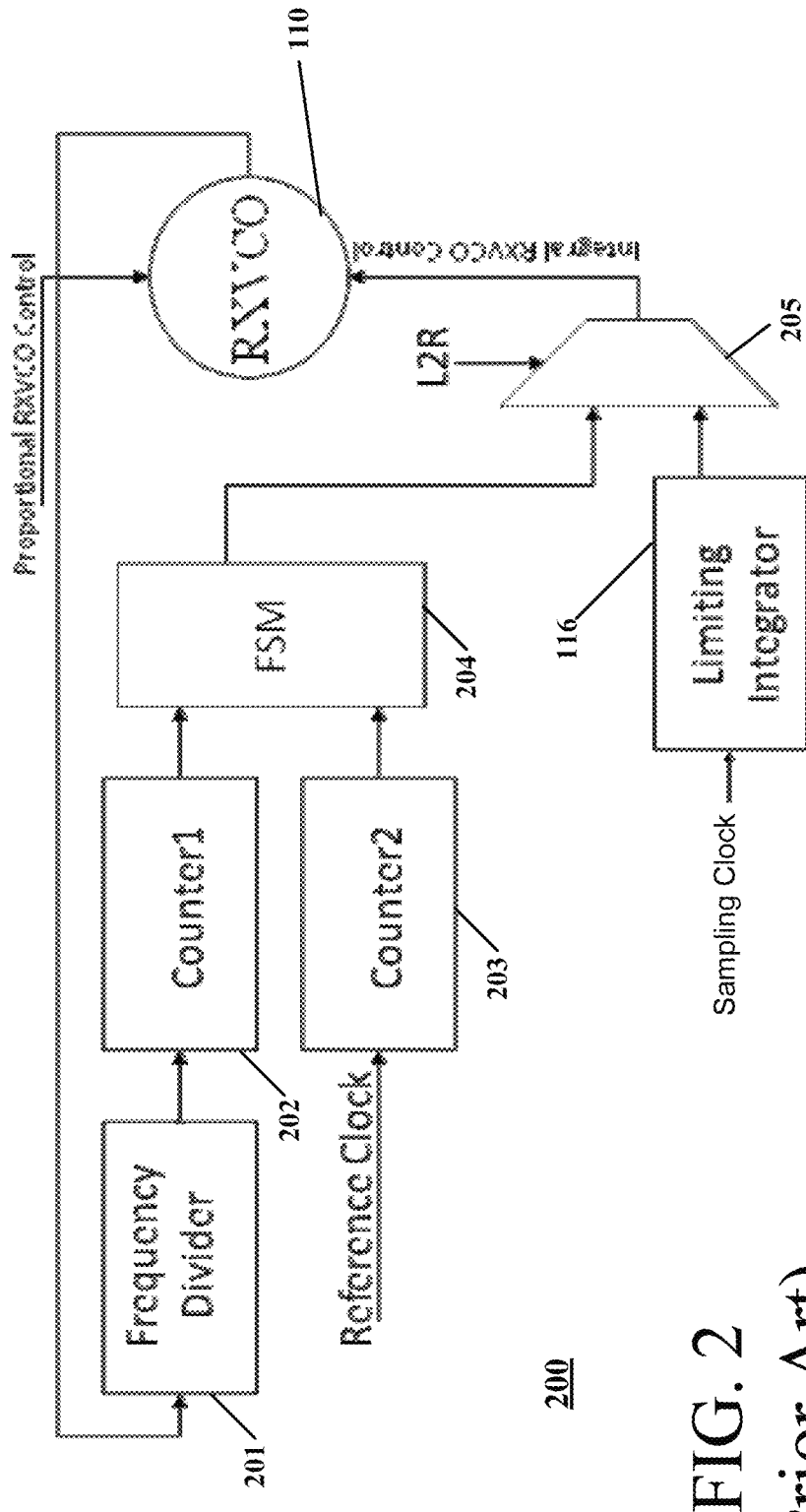
FIG. 2 shows a portion of the CDR of FIG. 1 incorporating a counter-based lock to reference mode of operation of the prior art.
Figure 3:
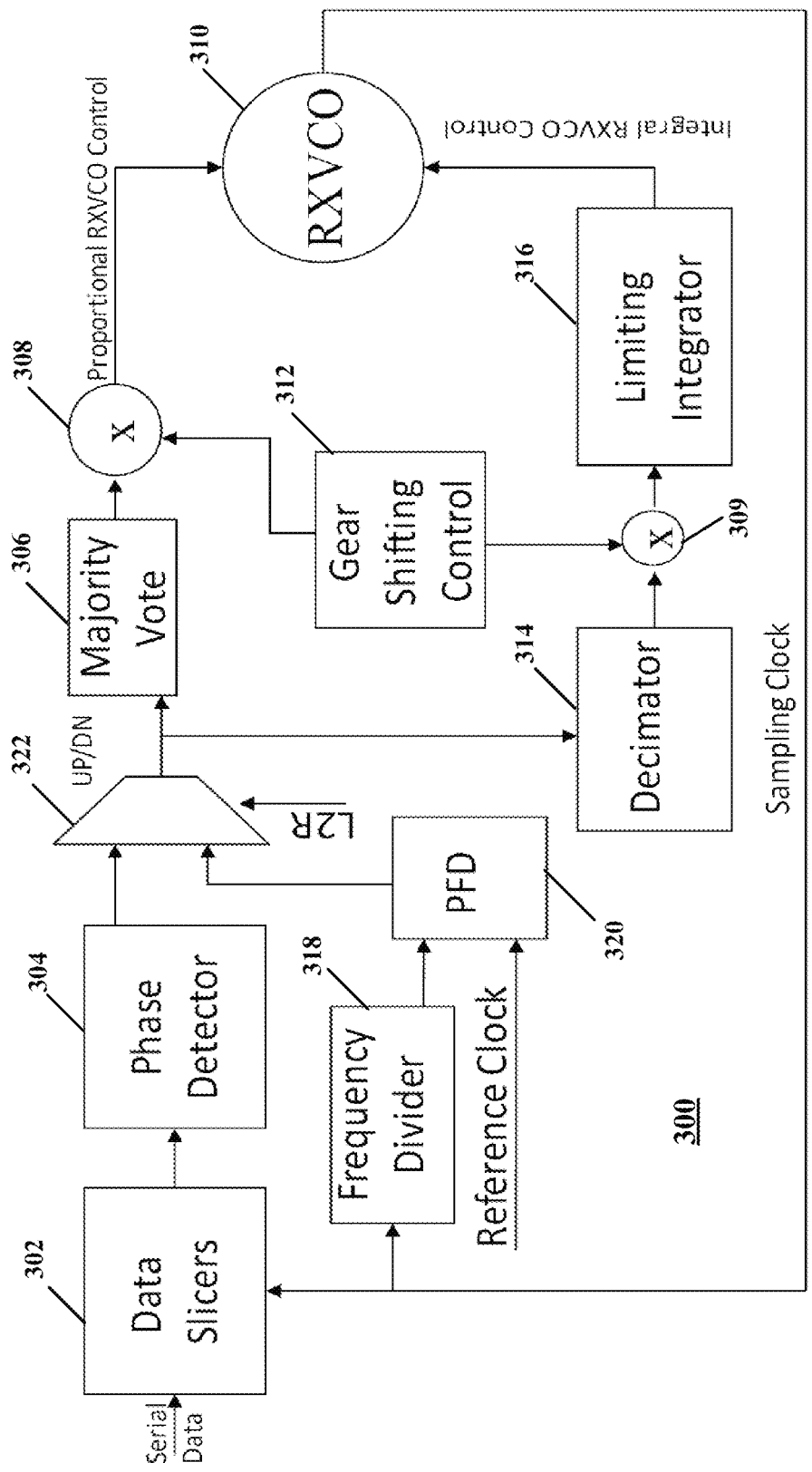
FIG. 3 shows a block diagram of an exemplary CDR system operating in accordance with embodiments of the present invention.

FIG. 3 shows a block diagram of an exemplary CDR system 300 operating in accordance with embodiments of the present invention. CDR system 300 comprises data slicers 302, phase detector 304, majority vote block 306, optional multipliers 308 and 309, receiver VCO (RXVCO) 310, optional gear shifting control 312, decimator 314, limiting integrator 316, frequency divider 318, phase and frequency detector (PFD) 320 and MUX 322. Operation of CDR system 300 is now described.

When not in L2R mode, serial data is applied to data slicers 302 which sample data once per unit interval (or more frequently, for oversampling data) to provide samples to phase detector 304, as well as to data recovery circuitry (not shown in FIG. 3). Phase detector 304 detects and generates a set of phase error signals for the proportional and integral loop controls from the sampled data stream, that are provided through MUX 322. Specifically, phase detector 304 generates sampling clock phase adjustments (up or down) that are used to update the sampling clock from the output of the RXVCO 310 provided to data slicers 102 through a controlled output sampling clock derived from the output of RXVCO 310. RXVCO 310 receives input from two loop controls, Proportional and Integral Control loops, such as derived from relations (1) and (2), repeated below:

$$F_{VCO}=F_0+D_I*KVCO_I+D_P*KVCO_P \quad (1)$$

$$\Phi_{VCO}=\int F_{VCO}dt \quad (2)$$

A phase update request from phase detector 304 might utilize majority vote block 306, where a sequence of multiple phase update requests are converted to a single up, down, or no phase update operation. The resulting phase update from majority vote block 306 might also be processed by optional gear shifting block 312 and multiplier 308. This processing by optional gear shifting block 312 and multiplier 308 might have a higher multiplication coefficient in the initial phase of locking to a serial data stream, providing for wider bandwidth, in order to reduce the time required to phase lock to the incoming serial data rate. After start-up, over the course of time, the gain of gear shifting block 312 and multiplier 308 is reduced, narrowing the bandwidth, and, thus, reducing the self-jitter of the bang-bang phase detector based implementation of CDR 300. The final phase update request from the gear shifting multiplier is applied as a proportional control word to RXVCO 310. RXVCO 310 might be implemented as one or more D/A converters whose outputs serve as the control voltage input to an LC oscillator with varactor-type control of the frequency, or as a ring-based VCO.

The integral control word is generated by integrating, with limiting integrator 316, the output of phase detector 304 via MUX 322. Processing frequency might be reduced through use of decimated output of phase detector 304 before integration. Therefore, the output of phase detector 304 might be decimated via decimator 314 prior to application to limiting integrator 316. The integer value of limiting integrator 316 is the integral control word that changes for an extended duration of time until limiting integrator 416 accumulates a different integer value. As described previously, the integral control is modified at startup through action of gear shifting control and multiplier 309.

When serial data is not present, CDR 300 enters L2R mode in order to lock to a Reference Clock signal locally generated, and RXVCO 310 output signal frequency is divided down in frequency divider 318 to the Reference Clock rate. The Reference Clock and the divided RXVCO 310 output signal clock are provided to the inputs of PFD 320, and the output UP and DN adjustment requests applied to MUX 322. MUX 322, in response to the L2R mode enable signal, feeds the output UP and DN adjustment requests into RXVCO Proportional and Integral control paths in place of data path Phase Detector 304 UP and DN. The operation of the Proportional and Integral Control loops of RXVCO 310 remains unchanged from that when L2R mode is disabled and serial data is present.

If RXVCO 310 output signal frequency is not phase and frequency aligned with the Reference Clock, RXVCO 310 output signal frequency is adjusted through the Proportional Control loop and accumulated in limiting integrator 316 to provide the integral control word until the two frequencies are equal. Phase alignment is not necessarily required in this mode, since phase lock will be achieved to serial data after L2R mode is exited.

Since RXVCO frequency adjustment in accordance with embodiments of the present invention avoids lengthy and repeatable counting cycles with counters, L2R mode lock to reference completes in much shorter time once entered. At the end of lock to reference in L2R mode, limiting integrator 316 provides the desired value of integral control word, so additional steps of loading this value into limiting integrator 316 are not required when switching back to a Lock to Data (L2D) mode (i.e., locking the locally generated clock to the clock extracted from the input serial data) when serial data is present. CDR 300 starts locking to incoming data from RXVCO frequency rate corresponding to the Reference Clock rate when L2R mode is disabled.

Figure 4:
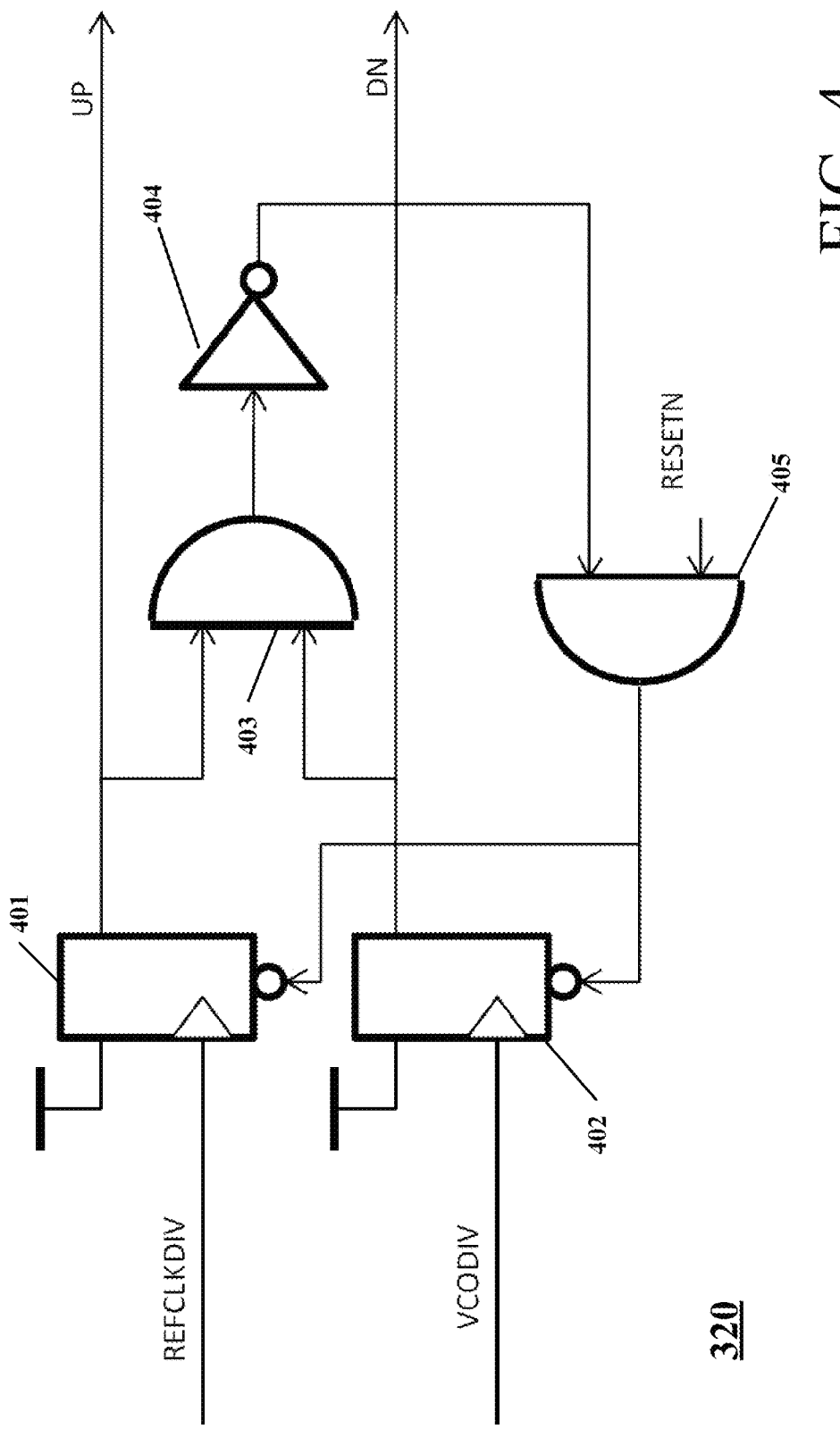
FIG. 4 shows a block diagram of a phase and frequency detector employed by the CDR system shown in FIG. 3.

FIG. 4 shows a block diagram of an exemplary PFD 320 as employed by CDR 300 shown in FIG. 3. PFD 320 comprises flip-flops 401 and 402, AND gates 403 and 405, and inverter 404. On the rising edge of the Reference Clock (optionally divided down to REFCLKDIV) or divided down RXVCO clock VCODIV (whichever is present earlier), UP or DN outputs of PFD 320 are set high. When later in time rising edge of another clock pulse arrives, both UP and DN flip-flops 401 and 402 are set high, and after propagation delay through two AND gates and inverter 404, UP and DN flip-flops 401 and 402 are reset low. The output UP and DN signals represent pulse width modulated UP and DN requests for VCO frequency adjustment.

In the case of an analog application, UP and DN pulse width modulated signals might be employed as inputs to a charge pump which effectively subtracts DN pulse area from UP pulse area, thereby accumulating frequency control signal for VCO. In the case of digitally controlled RXVCO and CDR architecture as described for the exemplary embodiments herein, UP and DN signals from PFD 320 are desireably converted into UP and/or DN binary requests. A preferred conversion from pulse width modulation to binary valued output samples UP and DN pulses with a relatively high available sampling frequency and some post processing might be performed. A block diagram of PFD 320 coupled with such sampling and post processing is shown in FIG. 5.

Figure 5:
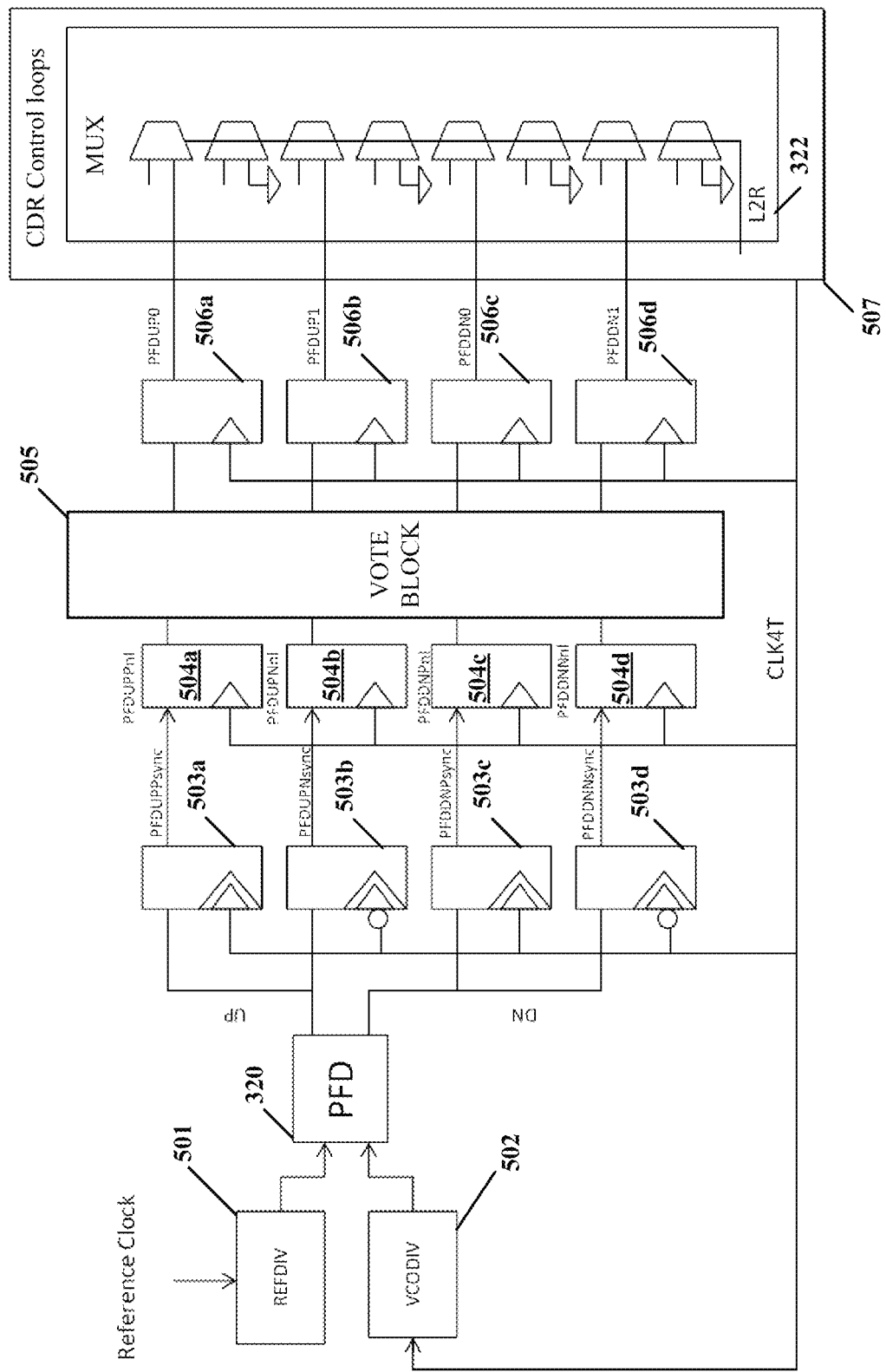
FIG. 5 shows an exemplary architecture of a phase and frequency detector incorporating sampling and post processing in accordance with an exemplary embodiment of the present invention.

As shown in FIG. 5, the Reference Clock is divided in divider REFDIV 501 and the RXVCO output clock signal is divided in divider VCODIV 502. If the Reference Clock is available at 16 T (T—Unit Interval of the expected serial data rate), and the highest available rate of the RXVCO signal clock is 4 T, then the REFDIV 501 divisor coefficient is set to "1", and VCODIV 502 divisor is set to "4". The same expected 16 T rate clocks are provided as inputs to PFD 320, such as described above with respect to FIG. 4, which produces pulse width modulated UP and DN output values.

UP and DN signals are sampled using multi stage synchronizers 503a-503d (in order to guard against a meta-stability condition) on the rising and falling edge of the 4 T clock (CLK4T that might be generated internally from CDR 300) in order to make sampling rate as high as possible. The sampled, synchronized signals PFDUPPsync, PFDUPNsync, PFDDNPsync, and PFDDNNsync are latched in flip-flops 504a-504d to provide PFDUPPn1, PFDUPNn1, PFDDNPn1, and PFDDNNn1 in order to align the signal sample values in time. These latched signals may optionally go through Vote Block 505 (e.g., voting logic) and additional latching by flip-flops 506a-506d in order to subtract simultaneous sampled DN signals from UP signals, or might be directly passed to the CDR (Proportional and Integral) Control loops 507 as PFDUP0, PFDUP1, PFDDN0, and PFDDN1 (if subtraction occurs as a later step in CDR 300). The final PFDUP0, PFDUP1, PFDDN0, and PFDDN1 phase update signals are multiplexed with data phase detector outputs in MUX 322 (as described above for RXVCO Proportional and Integral Control loops) for selection of the corresponding values when L2R mode is enabled or disabled (e.g., PFD 320 UP and DN requests are used in L2R mode while data phase detector 304 outputs are used in lock to data mode).

If the width of UP and DN outputs from PFD falls below 2 T, UP and DN outputs might be missed when sampled in the synchronizers. There are two possible cases which may produce such situation. In a first case, the RXVCO and Reference Clock signals are frequency aligned, but not phase aligned. This first case situation is generally acceptable since L2R mode desirably requires only frequency alignment. In a second case, the RXVCO and Reference Clock signals are not frequency aligned. For this second case, even if frequency offset is small, the phase difference grows over time, and UP and/or DN pulses from PFD 320 increase in duration. Consequently, the UP and/or DN pulses are eventually sampled again in the synchronizers, and L2R mode brings RXVCO output signal frequency to be nearly the Reference Clock frequency.

Figure 6:
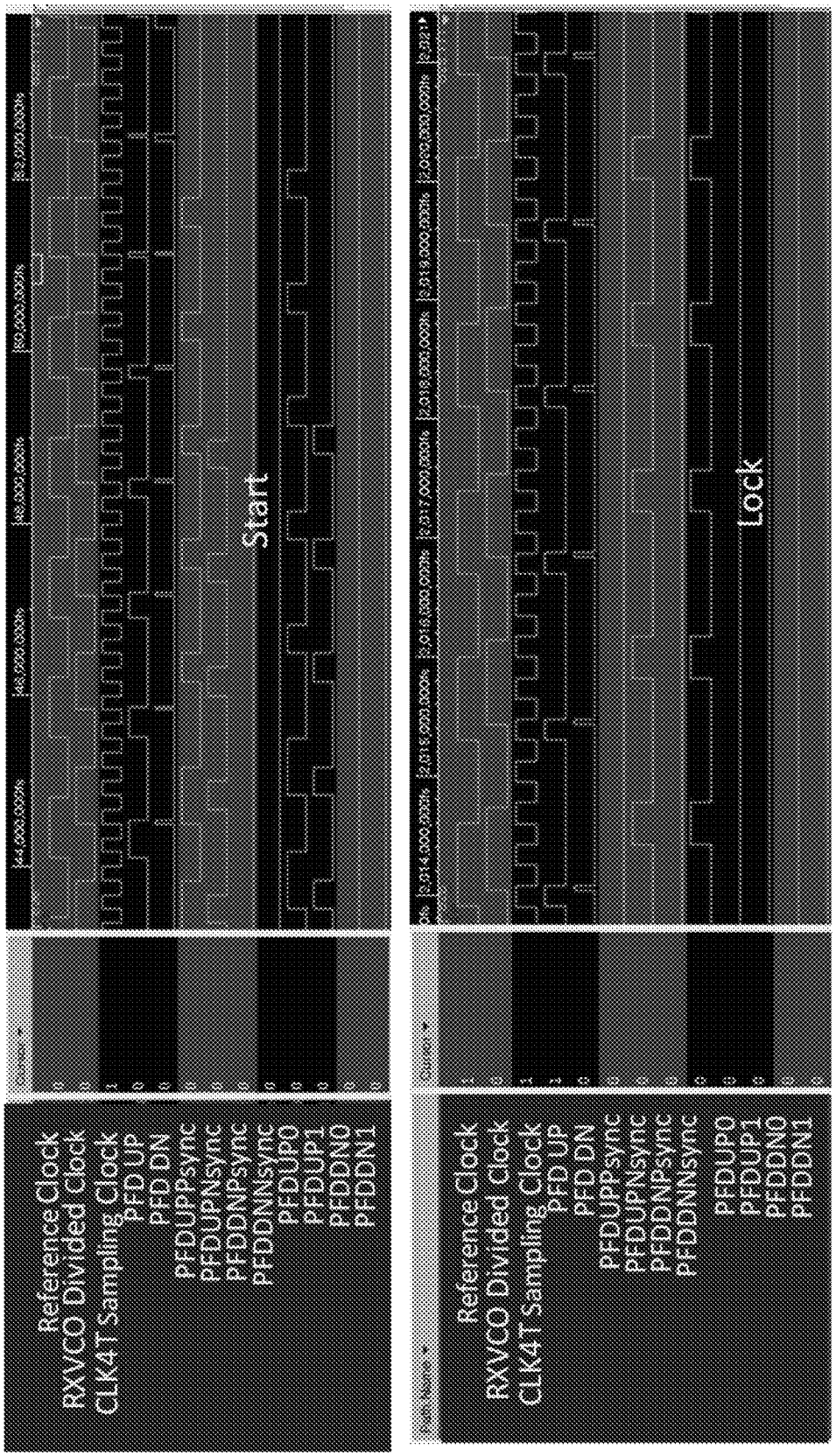
FIG. 6 shows wave forms of signals generated by the architecture of FIG. 5 at the start and at the end of L2R mode.

FIG. 6 shows waveforms of the various signals described herein generated by the architecture of FIG. 5 i) at the start and ii) at the end of L2R mode. The initial frequency offset is selected as 50,000 ppm, resulting in relatively wide PFD UP and DN pulses that are sampled and provided to the CDR control loops for RXVCO frequency adjustment. At the end of locking to the Reference Clock some phase misalignment might be present, but the frequency is adjusted such that PFD UP and DN pulses suspend production of any UP or DN requests to the CDR control loops.

Figure 7:
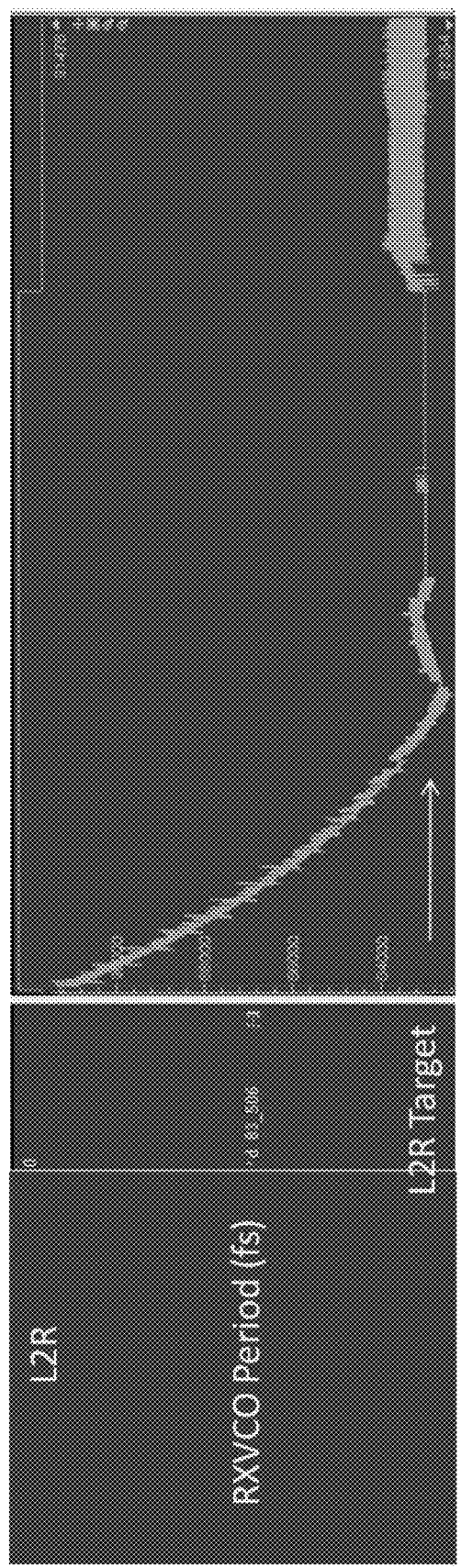
FIG. 7 illustrates changes in receiver VCO signal period over time for the architecture of FIG. 5.

During L2R mode, RXVCO signal period changes in time as shown in FIG. 7. After initial and slight under-shoot in an RXVCO signal period, an interval of time occurs when the RXVCO signal period is unchanged, which corresponds to UP and DN pulses being relatively narrow. Then, since there is a slight frequency offset between the RXVCO signal and the Reference Clock, UP and DN pulse width increases, which leads to additional frequency adjustment before the RXVCO signal frequency settles to a final value. After the L2R signal is de-asserted, disabling L2R mode, the RXVCO control loops start locking to the incoming serial data.

A transceiver operating in accordance with one or more embodiments of the present invention might provide for the following advantages. PFD based Lock to Reference allows frequency lock in much shorter interval of time than previously used counter based methods. The transceiver operating in accordance with one or more embodiments of the present invention might exhibit improved performance and increased reliability in unfavorable communication environments. Further, the transceiver operating in accordance with one or more embodiments of the present invention might possibly comply with SAS, SATA, and other applications requirements for a quick response to loss of signal or exit from power down. In some implementations of the present invention, a CDR is ready in a few microseconds to start receiving serial data error free.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here.

It will be further understood that various changes in the details, materials, and arrangements of the parts which have been described and illustrated in order to explain the nature of this invention may be made by those skilled in the art without departing from the scope of the invention as expressed in the following claims.

We claim:

1. Apparatus for controlling an oscillation frequency and phase in a receiver during a lock to reference (L2R) mode comprising:
 a voltage-controlled oscillator (VCO) configured to generate an output signal at the oscillation frequency and phase based on a proportional control word and an integral control word;
 a frequency divider configured to divide the output signal oscillation frequency of the VCO to substantially equivalent to a reference clock rate;
 a phase and frequency detector (PFD) configured to generate an L2R mode oscillation phase error from a comparison of the divided output signal oscillation frequency of the VCO and the reference clock;
 a proportional loop control configured to generate the proportional control word from the L2R mode oscillation phase error;
 an integral loop control having an integrator configured to integrate the L2R mode oscillation phase error to provide the integral control word to the VCO;
 at least one data slicer configured to sample input serial data with a sampling clock derived from the output signal of the VCO at the oscillation frequency and phase to provide a sampled data stream;
 a steady-state phase detector configured to generate a lock to data (L2D) mode oscillation phase error from the sampled data stream; and
 a multiplexer configured to provide, based on an L2R mode enable signal, either the L2R mode oscillation phase error or the L2D mode oscillation phase error to the proportional loop control and the integral loop control.

2. The apparatus of claim 1, comprising a conversion circuit configured to transform pulse with modulation data corresponding to the L2R mode oscillation phase error to binary valued output samples for the proportional loop control and the integral loop control.

3. The apparatus of claim 1, wherein the integral loop control includes a decimator configured to decimate the L2D mode oscillation phase error from the steady-state phase detector provided to the integrator.

4. The apparatus of claim 3, wherein the integrator is a limiting integrator.

5. The apparatus of claim 1, wherein the proportional loop control is configured to provide the proportional control word from a series of up and down phase update requests corresponding to the L2D mode oscillation phase error from the steady-state phase detector.

6. The apparatus of claim 1, further comprising a gear shifting control configured to provide a series of multiplication coefficients when locking the VCO to the reference clock to provide for (i) a transition between a wide loop bandwidth to reduce a time to lock to the data and (ii) a narrow loop bandwidth to reduce self-jitter during steady-state operation.

7. The apparatus of claim 1, wherein the apparatus is embodied in a Serializer-DeSerializer (SerDes) device.

8. The apparatus of claim 1, wherein the apparatus is embodied in a clock and data recovery circuit.

9. A method of controlling an oscillation frequency and phase in a receiver during a lock to reference (L2R) mode comprising:
generating, by a voltage-controlled oscillator (VCO), an output signal at the oscillation frequency and phase based on a proportional control word and an integral control word;
dividing the output signal oscillation frequency of the VCO to substantially equivalent to a reference clock rate;
generating, by a phase and frequency detector (PFD), an L2R mode oscillation phase error from a comparison of the divided output signal oscillation frequency of the VCO and the reference clock;
generating, by a proportional loop control, the proportional control word from the L2R mode oscillation phase error;
integrating, by an integral loop control having an integrator, the L2R mode oscillation phase error, thereby providing the integral control word to the voltage controlled oscillator VCO;
deriving a sampling clock from the output signal of the VCO at the oscillation frequency and phase;
sampling, with at least one data slicer, input serial data with the sampling clock thereby providing a sampled data stream;
generating, with a steady-state phase detector, a lock to data (L2D) mode oscillation phase error; and
providing, by a multiplexer based on an L2R mode enable signal, either the L2R mode oscillation phase error or the L2D mode oscillation phase error to the proportional loop control and the integral loop control.

10. The method of claim 9, comprising transforming pulse width modulation data corresponding to the L2R mode oscillation phase error to binary valued output samples for the proportional loop control and the integral loop control.

11. The method of claim 9, further comprising, for the integral loop control, decimating the L2D mode oscillation phase error from the steady-state phase detector provided to the integrator.

12. The method of claim 11, wherein the integrator is a limiting integrator.

13. The method of claim 9, further comprising providing, by the proportional loop control, the proportional control word from a series of up and down phase update requests corresponding to the L2D mode oscillation phase error from the steady-state phase detector.

14. The method of claim 9, further comprising providing, with a gear shifting control, a series of multiplication coefficients when locking the VCO to the reference clock, thereby providing for (i) a transition between a wide loop bandwidth to reduce a time to lock to the data and (ii) a narrow loop bandwidth to reduce self-jitter during steady-state operation.

15. The method of claim 9, wherein the method is embodied in a Serializer-DeSerializer (SerDes) device.

16. The method of claim 9, wherein the method is embodied as steps in a digital clock and data recovery routine.

17. A non-transitory, machine-readable storage medium, having encoded thereon program code, wherein, when the program code is executed by a machine, the machine implements a method for controlling an oscillation frequency and phase in a receiver during a lock to reference (L2R) mode, comprising the steps of:
generating, by a voltage-controlled oscillator (VCO), an output signal at the oscillation frequency and phase based on a proportional control word and an integral control word;
dividing the output signal oscillation frequency of the VCO to substantially equivalent to a reference clock rate;
generating, by a phase and frequency detector (PFD), an L2R mode oscillation phase error from a comparison of the divided output signal oscillation frequency of the VCO and the reference clock;
generating, by a proportional loop control, the proportional control word from the L2R mode oscillation phase error;
integrating, by an integral loop control having an integrator, the L2R mode oscillation phase error, thereby providing the integral control word to the VCO;
deriving a sampling clock from the output signal of the VCO at the oscillation frequency and phase;
sampling, with at least one data slicer, input serial data with the sampling clock thereby providing a sampled data stream;
generating, with a steady-state phase detector, a lock to data (L2D) mode oscillation phase error; and
providing, by a multiplexer based on an L2R mode enable signal, either the L2R mode oscillation phase error or the L2D mode oscillation phase error to the proportional loop control and the integral loop control.

18. An apparatus for controlling an oscillation frequency and phase in a receiver during a lock to reference (L2R) mode comprising:
a voltage-controlled oscillator (VCO) configured to generate an output signal at the oscillation frequency and phase based on a proportional control word and an integral control word;
a frequency divider configured to divide the output signal oscillation frequency of the VCO to substantially equivalent to a reference clock rate;
a phase and frequency detector (PFD) configured to generate an L2R mode oscillation phase error from a comparison of the divided output signal oscillation frequency of the VCO and the reference clock;
a proportional loop control configured to generate the proportional control word from the L2R mode oscillation phase error; and
an integral loop control having an integrator configured to integrate the L2R mode oscillation phase error to provide the integral control word to the VCO,
wherein the proportional loop control is configured to provide the proportional control word from a series of up and down phase update requests corresponding to the L2D mode oscillation phase error from a steady-state phase detector.

19. An apparatus for controlling an oscillation frequency and phase in a receiver during a lock to reference (L2R) mode comprising:
a voltage-controlled oscillator (VCO) configured to generate an output signal at the oscillation frequency and phase based on a proportional control word and an integral control word;
a frequency divider configured to divide the output signal oscillation frequency of the VCO to substantially equivalent to a reference clock rate;
a phase and frequency detector (PFD) configured to generate an L2R mode oscillation phase error from a comparison of the divided output signal oscillation frequency of the VCO and the reference clock;
a proportional loop control configured to generate the proportional control word from the L2R mode oscillation phase error;
an integral loop control having an integrator configured to integrate the L2R mode oscillation phase error to provide the integral control word to the VCO; and a gear shifting control configured to provide a series of multiplication coefficients when locking the VCO to the reference clock to provide for (i) a transition between a wide loop bandwidth to reduce a time to lock to the data and (ii) a narrow loop bandwidth to reduce self-jitter during steady-state operation.

20. A method of controlling an oscillation frequency and phase in a receiver during a lock to reference (L2R) mode comprising:
- generating, by a voltage-controlled oscillator (VCO), an output signal at the oscillation frequency and phase based on a proportional control word and an integral control word;
- dividing the output signal oscillation frequency of the VCO to substantially equivalent to a reference clock rate;
- generating, by a phase and frequency detector (PFD), an L2R mode oscillation phase error from a comparison of the divided output signal oscillation frequency of the VCO and the reference clock;
- generating, by a proportional loop control, the proportional control word from the L2R mode oscillation phase error;
- integrating, by an integral loop control having an integrator, the L2R mode oscillation phase error, thereby providing the integral control word to the VCO; and
- providing, by the proportional loop control, the proportional control word from a series of up and down phase update requests corresponding to the L2D mode oscillation phase error from a steady-state phase detector.

21. A method of controlling an oscillation frequency and phase in a receiver during a lock to reference (L2R) mode comprising:
- generating, by a voltage-controlled oscillator (VCO), an output signal at the oscillation frequency and phase based on a proportional control word and an integral control word;
- dividing the output signal oscillation frequency of the VCO to substantially equivalent to a reference clock rate;
- generating, by a phase and frequency detector (PFD), an L2R mode oscillation phase error from a comparison of the divided output signal oscillation frequency of the VCO and the reference clock;
- generating, by a proportional loop control, the proportional control word from the L2R mode oscillation phase error;
- integrating, by an integral loop control having an integrator, the L2R mode oscillation phase error, thereby providing the integral control word to the VCO; and
- providing, with a gear shifting control, a series of multiplication coefficients when locking the VCO to the reference clock, thereby providing for (i) a transition between a wide loop bandwidth to reduce a time to lock to the data and (ii) a narrow loop bandwidth to reduce self-jitter during steady-state operation.

* * * * *